United States Patent
Kuo et al.

(10) Patent No.: US 10,606,294 B1
(45) Date of Patent: Mar. 31, 2020

(54) LOW DROPOUT VOLTAGE REGULATOR AND RELATED METHOD

(71) Applicant: NOVATEK Microelectronics Corp., Hsin-Chu (TW)

(72) Inventors: Liang-Ting Kuo, Tainan (TW); Mu-Jung Chen, Tainan (TW); Chi-Chun Liao, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/240,778

(22) Filed: Jan. 6, 2019

(51) Int. Cl.
| | |
|---|---|
| *G05F 1/575* | (2006.01) |
| *H03M 1/38* | (2006.01) |
| *H03M 1/06* | (2006.01) |
| *H02M 1/14* | (2006.01) |

(52) U.S. Cl.
CPC .......... *G05F 1/575* (2013.01); *H03M 1/0604* (2013.01); *H03M 1/38* (2013.01); *H02M 1/14* (2013.01)

(58) Field of Classification Search
CPC . G05F 1/46; G05F 1/461; G05F 1/462; G05F 1/56; G05F 1/565; G05F 1/575
See application file for complete search history.

(56) References Cited

U.S. PATENT DOCUMENTS

| | | | | |
|---|---|---|---|---|
| 5,315,174 | A * | 5/1994 | Chang ............ | H03K 19/018585 326/27 |
| 7,218,168 | B1 * | 5/2007 | Rahman .................... | G05F 1/56 323/273 |
| 2009/0079406 | A1 * | 3/2009 | Deng ...................... | G05F 1/565 323/280 |
| 2009/0189577 | A1 * | 7/2009 | Lin ........................... | G05F 1/56 323/273 |
| 2009/0237048 | A1 * | 9/2009 | Hou ........................ | G05F 1/575 323/282 |
| 2010/0237839 | A1 * | 9/2010 | Gurcan .................... | G05F 1/565 323/273 |
| 2012/0086420 | A1 * | 4/2012 | Simmons ................. | G05F 1/575 323/282 |
| 2016/0054747 | A1 * | 2/2016 | Cohen ...................... | G05F 1/567 713/300 |
| 2016/0098050 | A1 * | 4/2016 | Enjalbert .................. | G05F 1/56 323/280 |
| 2019/0138043 | A1 * | 5/2019 | Wang ........................ | G05F 3/26 |

FOREIGN PATENT DOCUMENTS

WO WO-2012030329 A1 * 3/2012 ........... G06F 1/3203

* cited by examiner

*Primary Examiner* — Gary L Laxton
(74) *Attorney, Agent, or Firm* — Winston Hsu (57) ABSTRACT

A low dropout voltage regulator, coupled to a load circuit receiving a clock signal, includes an amplifier; a power transistor comprising a control terminal, coupled to an output terminal of the amplifier; and a first terminal, coupled to a positive input terminal of the amplifier and the load circuit; and a control circuit, configured to control a current flowing through the power transistor in response to the clock signal.

16 Claims, 8 Drawing Sheets

LOW DROPOUT VOLTAGE REGULATOR AND RELATED METHOD

BACKGROUND OF THE INVENTION

1. Field of the Invention

The present invention relates to a low dropout voltage regulator and related method, and more particularly, to a low dropout voltage regulator and related method capable of suppressing ripple of an output voltage of the LDO with clock-based circuits.

2. Description of the Prior Art

Clock-based circuits, like successive approximation register analog-to-digital converter (SAR ADC), flash analog-to-digital converter (flash ADC) and switch-based amplifier, features low power. For example, SAR ADC has been widely used in various applications. For energy concern, the SAR ADC may be supplied by a relative low DC (direct current) voltage. Low dropout voltage regulator (LDO) is utilized to provide power supply for the SAR ADC.

However, the SAR ADC draws more current when a clock signal is low, which causes ripples within an output voltage of the LDO, and may degrade performance of the SAR ADC. Several methods have been used to suppress the ripples in the prior art. The LDO in the prior art may include a power transistor with a larger size, but the circuit area is increased. The LDO in the prior art may increase a current flowing through the power transistor at all time, but power consumption is increased. The LDO in the prior art may enlarge a load capacitor connecting to the SAR ADC, but the circuit area is increased as well.

Therefore, it is necessary to improve the prior art.

SUMMARY OF THE INVENTION

It is therefore a primary objective of the present invention to provide a low dropout voltage regulator and related method capable of suppressing ripple of an output voltage of the LDO, to improve over disadvantages of the prior art.

An embodiment of the present invention discloses a low dropout voltage regulator (LDO), coupled to a load circuit receiving a clock signal. The LDO comprises an amplifier; a power transistor comprising a control terminal, coupled to an output terminal of the amplifier; and a first terminal, coupled to a positive input terminal of the amplifier and the load circuit; and a control circuit, configured to control a current flowing through the power transistor in response to the clock signal.

An embodiment of the present invention discloses a method applied for a low dropout voltage regulator (LDO), wherein the LDO comprises an amplifier and a power transistor, and the power transistor comprises a control terminal coupled to an output terminal of the amplifier and a first terminal coupled to a negative terminal of the amplifier and a load circuit receiving a clock signal. The method comprises controlling a current flowing through the power transistor in response to the clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
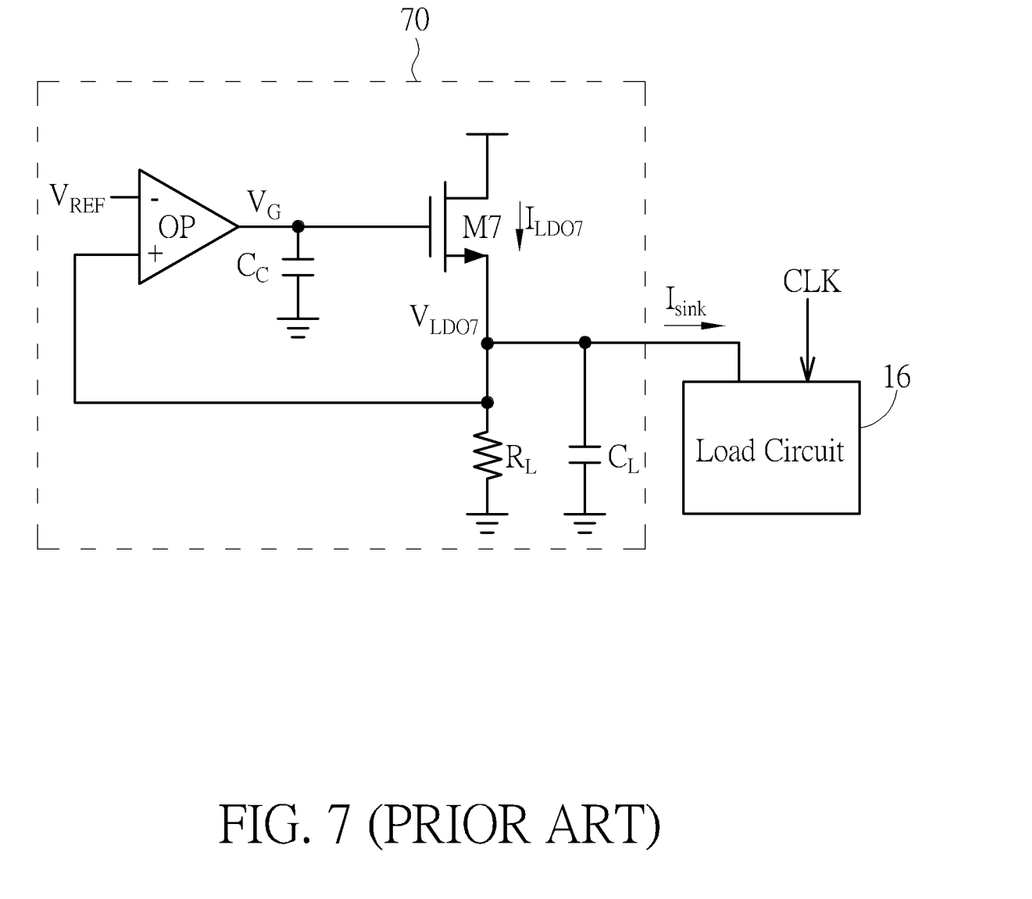
FIG. 7 is a schematic diagram of an LDO in the art.
Figure 8:
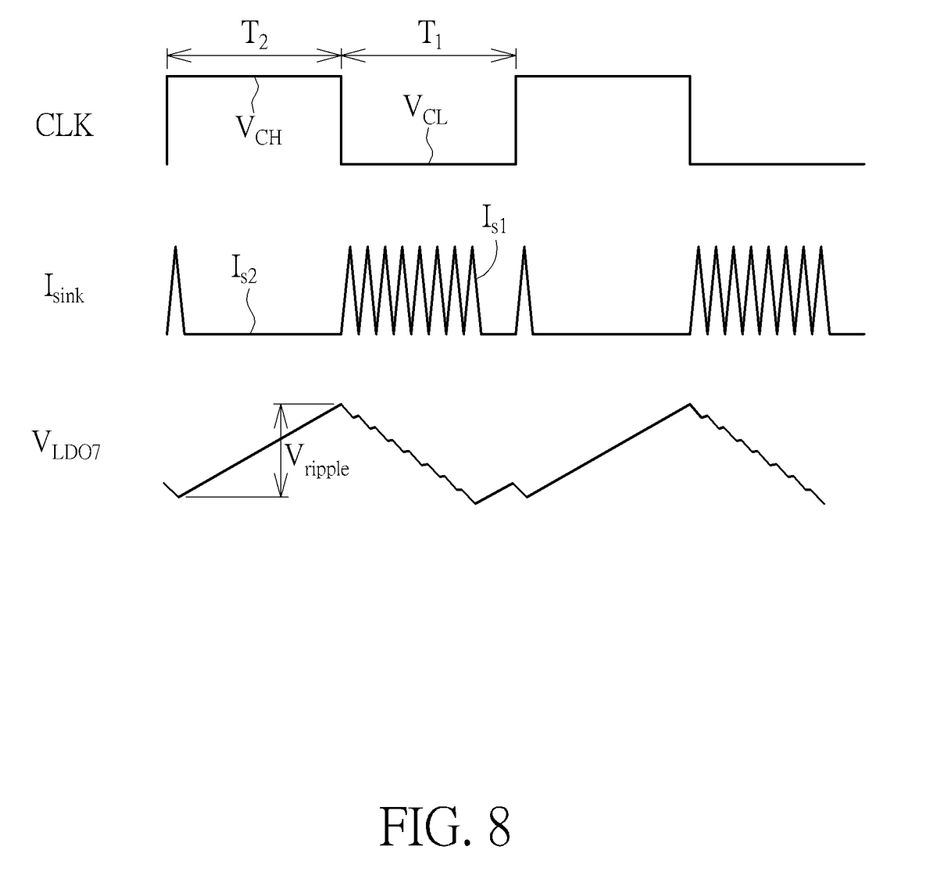
FIG. 8 is a schematic diagram of a plurality of signal waveforms of the LDO of FIG. 7.

FIG. 7 is a schematic diagram of a low dropout voltage regulator (LDO) 70 in the art. The LDO 70 comprises a power transistor M7 and an operational amplifier OP, where a current $I_{LDO7}$ flows through the power transistor M7. The LDO 70 is coupled to a load circuit 16 and configured to provide an output voltage $V_{LDO7}$ to the load circuit 16. The output voltage $V_{LDO7}$ is expected to be a stable DC (direct current) voltage. The load circuit 16 receives a clock signal CLK and draws a sink current $I_{sink}$ from the LDO 10. In an embodiment, the load circuit 16 may be a successive approximation register analog-to-digital converter (SAR ADC). Timing diagrams of the clock signal CLK and the sink current $I_{sink}$ are shown in FIG. 8. The clock signal CLK alternates between a low clock voltage $V_{CL}$ and a high clock voltage $V_{CH}$ where the clock signal CLK remains as the low clock voltage $V_{CL}$ during a first period $T_1$ and remains as the high clock voltage $V_{CH}$ during a second period $T_2$. In the embodiment illustrated in FIG. 8, the load circuit 16 would draw more sink current during the first period $T_1$ (corresponding to the low clock voltage $V_{CL}$) than during the second period $T_2$ (corresponding to the high clock voltage $V_{CH}$). That is, the load circuit 16 may draw a first sink current $I_{s1}$ in the first period $T_1$ and draw a second sink current $I_{s2}$ in the second period $T_2$, where the first sink current $I_{s1}$ is larger than the second sink current $I_{s2}$. The extra sink current during the first period $T_1$ would cause the output voltage $V_{LDO7}$ to have some ripples, denoted as $V_{ripple}$ in FIG. 8, which degrades performance of the load circuit 16. For example, a dynamic range of the load circuit 16 may be shrunk due to the ripple $V_{ripple}$ and the output voltage $V_{LDO7}$ is not such stable as expected.

To solve the ripple problem, the LDO of the present invention is to increase the current flowing through the power transistor of the LDO in response to the clock signal CLK fed into the load circuit 16. For the load circuit 16, which draws more sink current during a low-state period of the clock signal CLK (where the low state of the clock signal CLK is corresponding to the first period $T_1$ in which the clock signal CLK remains as the low clock voltage $V_{CL}$), the LDO of the present invention increases the current flowing through the power transistor when the clock signal CLK is low and returns to a normal current when the clock signal CLK is high.

Figure 1:
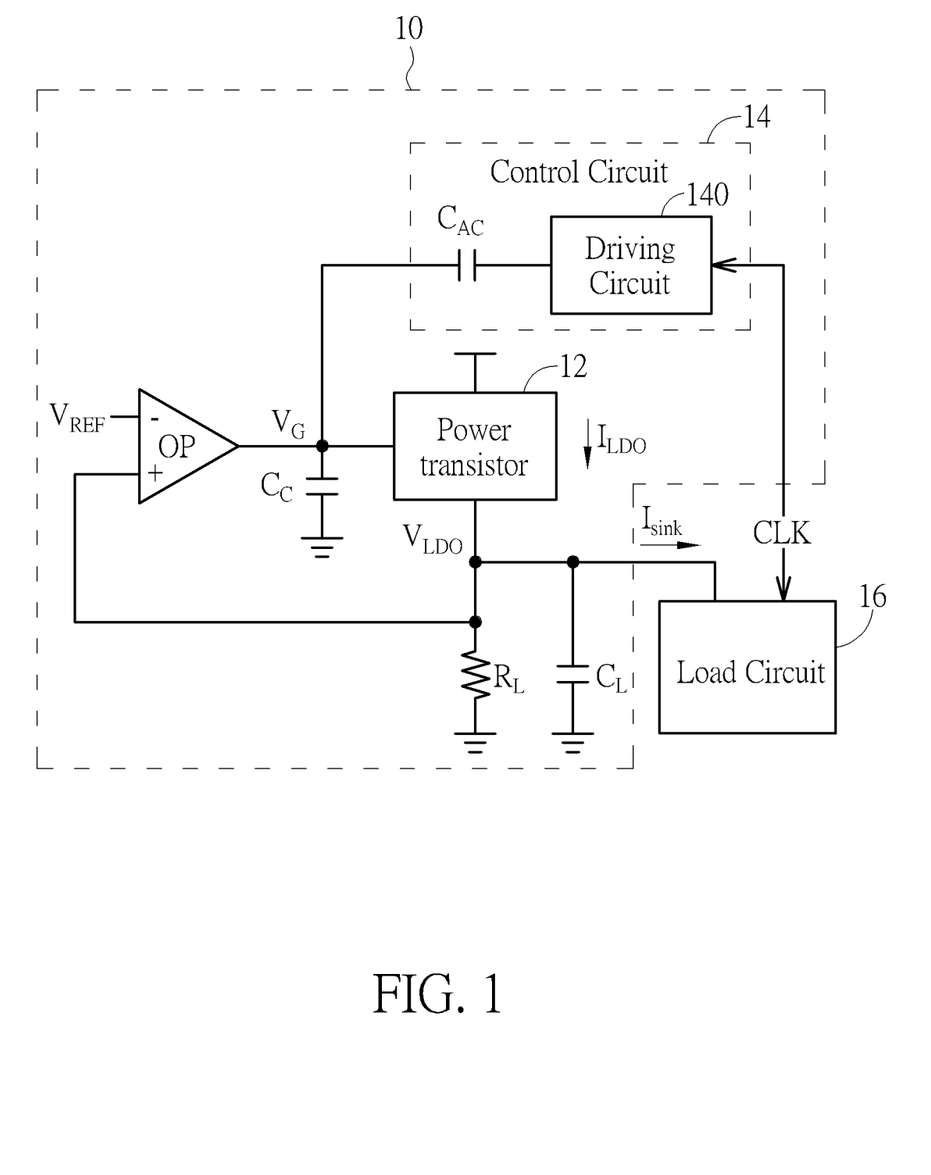
FIG. 1 is a schematic diagram of a low dropout voltage regulator (LDO) according to an embodiment of the present invention.

FIG. 1 is a schematic diagram of an LDO 10 according to an embodiment of the present invention. The LDO 10 is connected to the load circuit 16. The LDO 10 comprises the amplifier OP, a power transistor 12 and a control circuit 14. A control terminal of the power transistor 12 is coupled to an output terminal of the amplifier. The control terminal of the power transistor 12 may be a gate terminal when the power transistor 12 is an FET (field-effect transistor), or be a base terminal when the power transistor 12 is a BJT (bipolar junction transistor). The following description would assume the power transistor 12 is an FET, but not limited thereto. A first terminal of the power transistor 12 is coupled to a positive input terminal (denoted as "+" in FIG. 1) of the amplifier OP. Suppose that the power transistor 12 is an FET, the first terminal of the power transistor 12 may be a source terminal when the power transistor 12 is an N-type transistor or be a drain terminal when the power transistor 12 is a P-type transistor. The first terminal of the power transistor 12 is connected to the load circuit 16, to provide an output voltage $V_{LDO}$ to the load circuit 16. The first terminal of the power transistor 12 is connected to a load resistor $R_L$ and a load capacitor $C_L$. The clock signal CLK and the sink current $I_{sink}$ are illustrated in FIG. 8.

The control circuit 14 is configured to control a current $I_{LDO}$ flowing through the power transistor 12 in response to the clock signal CLK. Specifically, the control circuit 14 controls the power transistor 12 to have a first current $I_{LDO\_1}$ flowing through it (i.e., flowing through the power transistor 12) during the first period $T_1$ and have a second current $I_{LDO\_2}$ flowing through during the second period $T_2$, where the first current $I_{LDO\_1}$ is larger than the second current $I_{LDO\_2}$. That is, the current $I_{LDO}$ would be equal to the first current $I_{LDO\_1}$ during the first period $T_1$ and be equal to the second current $I_{LDO\_2}$ during the second period $T_2$, where $I_{LDO\_1} > I_{LDO\_2}$. In another perspective, in order to control the current $I_{LDO}$ flowing through the power transistor 12, the control circuit 14 produces a coupling signal/voltage $V_G$ to the control terminal of the power transistor 12, where the coupling signal/voltage $V_G$ is synchronized with the clock signal CLK.

In an embodiment, as FIG. 1 shown, the control circuit 14 comprises a coupling capacitor $C_{AC}$ and a driving circuit 140. The driving circuit 140 receives the clock signal CLK, which is also fed into the load circuit 16, and the coupling capacitor $C_{AC}$ is coupled between the driving circuit 140 and the control terminal of the power transistor 12. The driving circuit 140 is configured to drive the coupling capacitor $C_{AC}$ and a capacitor $C_C$, such that the coupling signal/voltage $V_G$ is synchronized with the clock signal CLK. The signal $V_G$ being synchronized with the clock signal CLK means that an edge time instant (either rising edge or falling edge) of the coupling signal $V_G$ is aligned with which of the clock signal CLK, without considering transient periods (either from a high voltage to a low voltage or from the low voltage to the high voltage) of the clock signal CLK and the coupling signal $V_G$.

Figure 2:
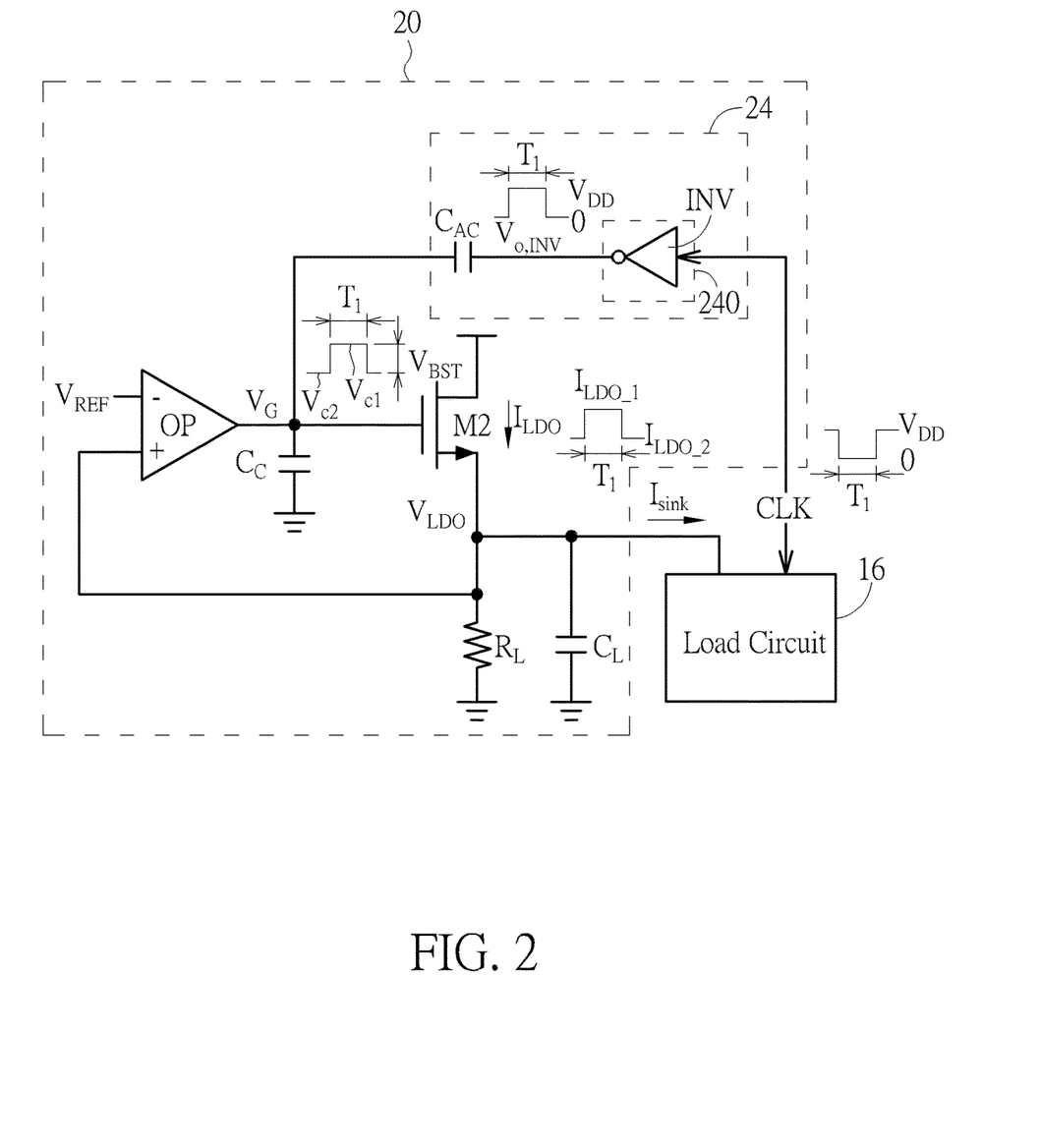
FIG. 2 is a schematic diagram of an LDO according to an embodiment of the present invention.

FIG. 2 is a schematic diagram of an LDO 20 according to an embodiment of the present invention. The LDO 20 is similar to the LDO 10. In the LDO 20, a driving circuit 240 comprises an inverter INV. The driving circuit 240 and the coupling capacitor $C_{AC}$ form a control circuit 24. The power transistor M2 in the LDO 20 is an NMOS, an N-type transistor. When the clock signal CLK transits from the high clock voltage $V_{CH}$ (e.g., $V_{CH}=V_{DD}$, where $V_{DD}$ is a positive voltage) to the low clock voltage $V_{CL}$ (e.g., $V_{CL}=0$) during the first period $T_1$, the driving circuit 240 comprising the inverter INV would produce an output voltage $V_{o,INV}$ from 0V to $V_{DD}$ during the first period $T_1$, assuming that the inverter INV is biased between 0V to $V_{DD}$. The coupling signal/voltage $V_G$ would gain a boost/increment voltage $V_{BST}$ during the first period $T_1$, where the boost/increment voltage $V_{BST}$ may be expressed as $V_{BST}=(C_{AC}/(C_{AC}+C_C))*V_{DD}$. Therefore, the current $I_{LDO}$ flowing through the power transistor M2 would be increased during first period $T_1$. Thereby, the ripple voltage $V_{ripple}$ within an output voltage $V_{LDO}$ of the LDO 20 would be suppressed.

Figure 3:
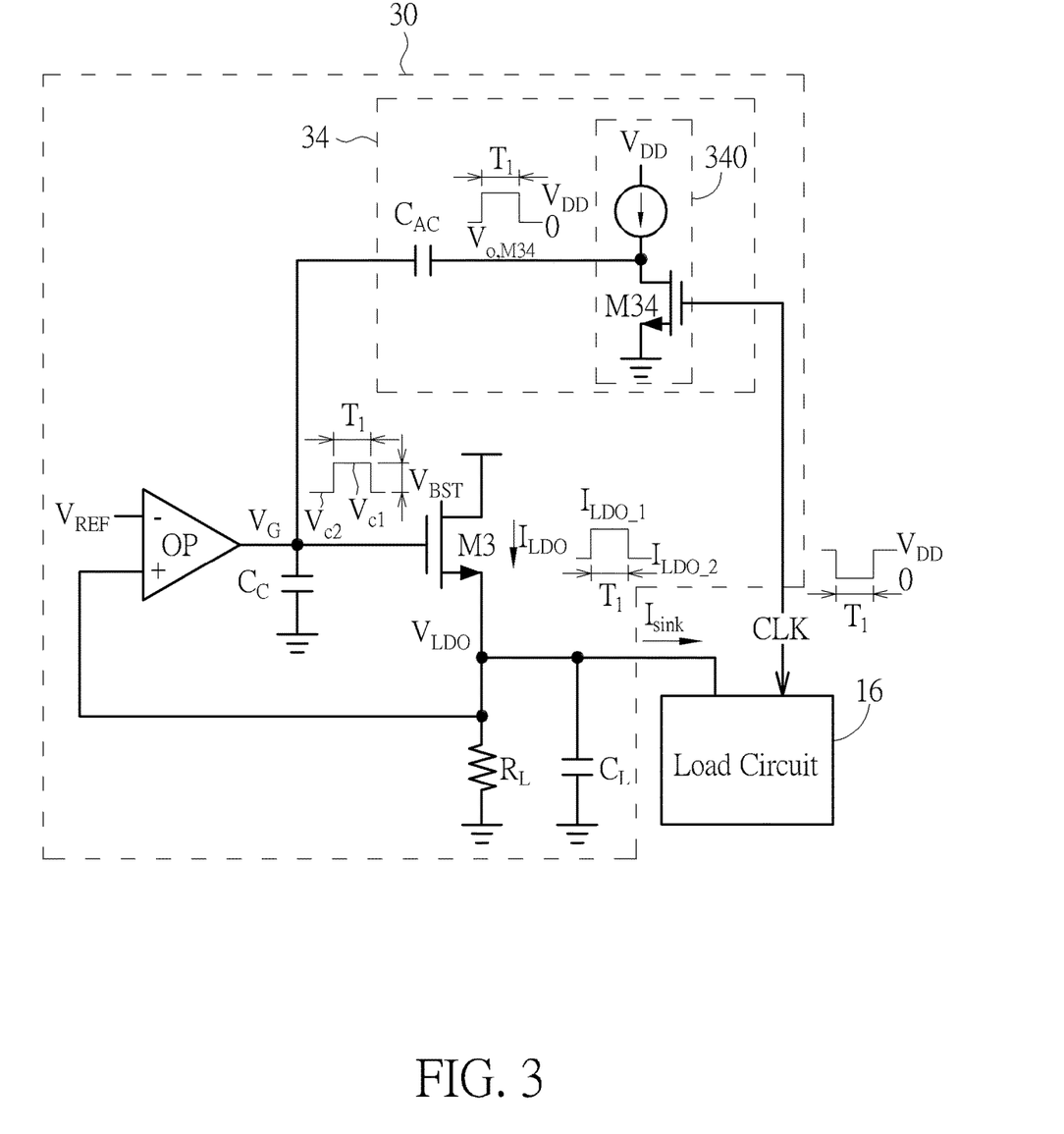
FIG. 3 is a schematic diagram of an LDO according to an embodiment of the present invention.
Figure 4:
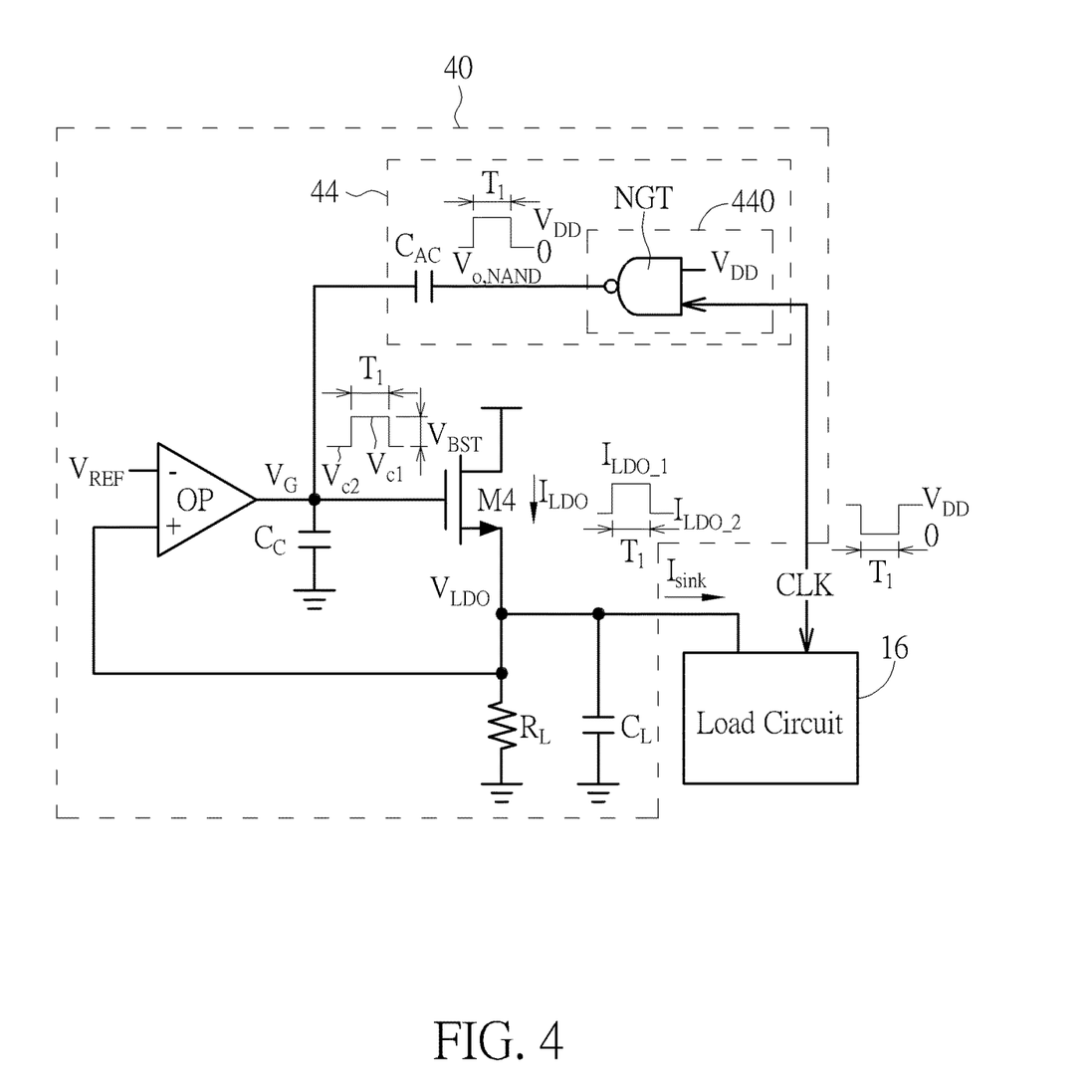
FIG. 4 is a schematic diagram of an LDO according to an embodiment of the present invention.

FIG. 3 and FIG. 4 are schematic diagrams of an LDO 30 and an LDO 40 according to embodiments of the present invention, respectively. The LDO 30 and the LDO 40 are similar to the LDO 20, where the power transistor M3 and M4 comprised within the LDOs 30 and 40 are both NMOS. Different from the LDO 20, a driving circuit 340 comprises an N-type transistor M34 coupled between a positive voltage supply providing the positive voltage $V_{DD}$ and a ground. As FIG. 3 shows, the transistor M34 may be coupled to the positive voltage supply providing $V_{DD}$ via a current source (which may simply be a PMOS or an active load). The transistor M34 is controlled by the clock signal CLK to be conducted or cutoff. When the clock signal CLK is $V_{DD}$, the transistor M34 is conducted and the driving circuit 340 produces an output voltage $V_{o,M34}$ as 0V. When the clock signal CLK is 0V during the first period $T_1$, the transistor M34 is cutoff and the driving circuit 340 produces the output voltage $V_{o,M34}$ as $V_{DD}$ in the first period $T_1$. In FIG. 4, a driving circuit 440 comprises a NAND gate NGT with an input terminal receiving the positive voltage $V_{DD}$. Note that, the NAND gate NGT with the input terminal receiving the positive voltage $V_{DD}$ is equivalent to the inverter INV, and the driving circuit 440 functions similarly to the driving circuit 240. The rest details of the LDOs 30 and 40 are the same as which of the LDO 20, which is not narrated herein for brevity.

Figure 5:
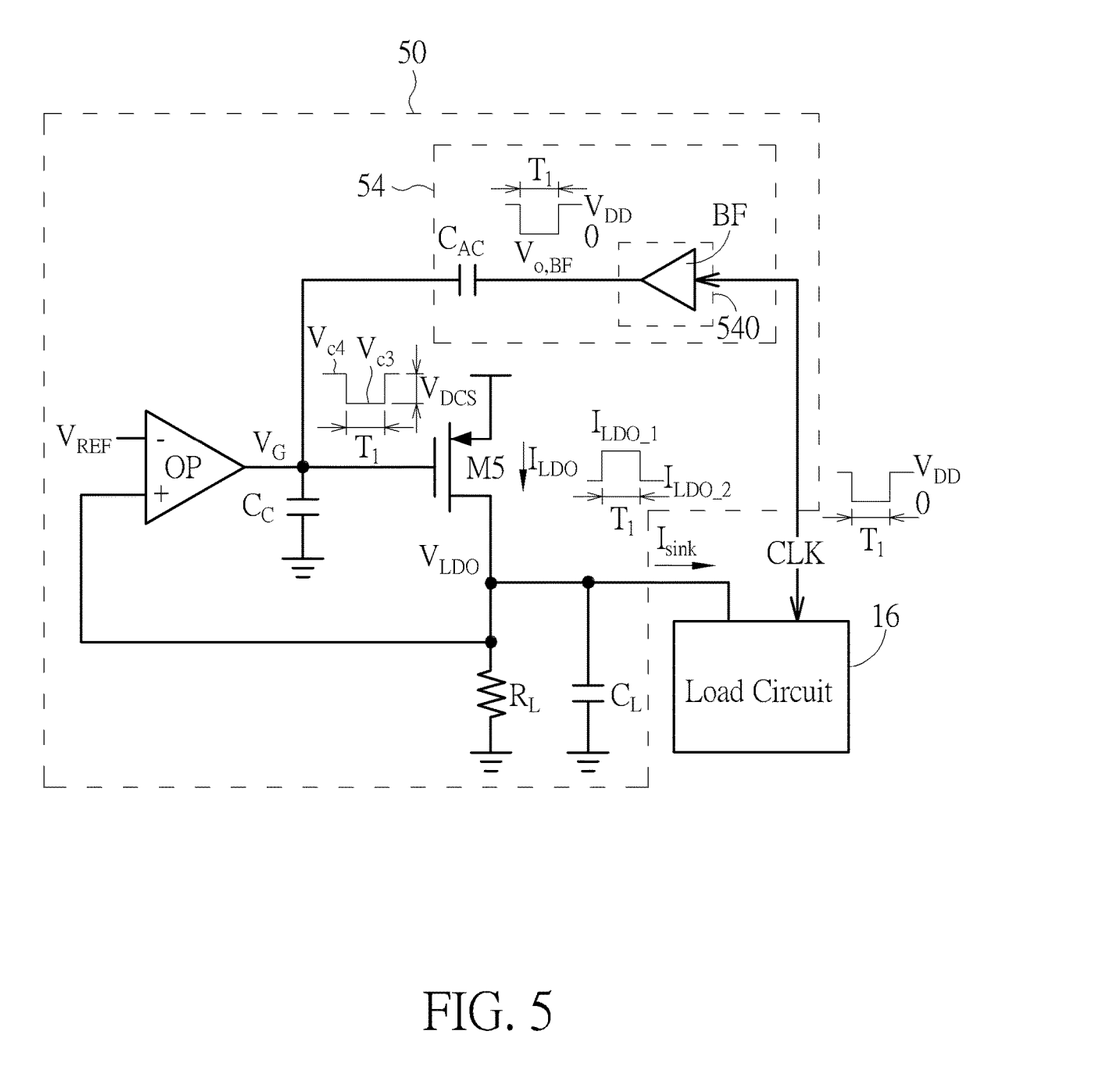
FIG. 5 is a schematic diagram of an LDO according to an embodiment of the present invention.

FIG. 5 is a schematic diagram of an LDO 50 according to an embodiment of the present invention. The LDO 50 is similar to the LDOs 20, 30 and 40. Different from them, the LDO 50 comprises a P-type power transistor M5 and a driving circuit 540. The driving circuit 540 comprises a buffer BF. An output voltage $V_{o,BF}$ of the buffer BF has a waveform similar to the clock signal CLK, which stays low during the first period $T_1$. The coupling signal/voltage $V_G$ would be decreased by a decrement voltage $V_{DCS}$ during the first period $T_1$, where the decrement voltage $V_{DCS}$ may be expressed as $V_{DCS}=(C_{AC}/(C_{AC}+C_C))*V_{DD}$, the same as $V_{BST}$. Due to the power transistor M5 being P-type, the current $I_{LDO}$ would also be increased during first period $T_1$.

In a short remark, when the power transistor within the LDO is N-type, the control circuit produces a first control voltage $V_{c1}$ (e.g., the coupling voltage $V_G$ with the increment voltage $V_{BST}$, shown in FIG. 2) to the control terminal of the power transistor during the first period $T_1$, and produces a second control voltage $V_{c1}$ (e.g., the coupling voltage $V_G$ without the increment voltage $V_{BST}$) to the control terminal of the power transistor during the second period $T_2$, where the first control voltage $V_{c1}$ is higher than the second control voltage $V_{c2}$. On the other hand, when the power transistor within the LDO is P-type, the control circuit produces a third control voltage $V_{c3}$ (e.g., the coupling voltage $V_G$ with the decrement voltage $V_{DCS}$, shown in FIG. 5) to the control terminal of the power transistor during the first period $T_1$, and produces a fourth control voltage $V_{c4}$ (e.g., the coupling voltage $V_G$ without the decrement voltage $V_{DCS}$, shown in FIG. 5) to the control terminal of the power transistor during the second period $T_2$, where the third control voltage $V_{c3}$ is lower than the fourth control voltage $V_{c4}$.

Figure 6:
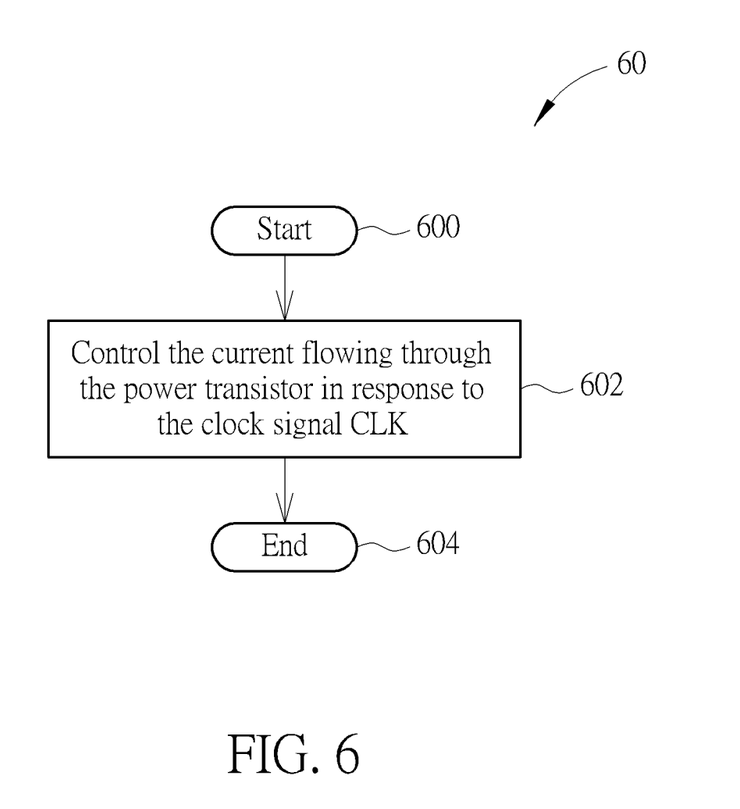
FIG. 6 is a schematic diagram of a process according to an embodiment of the present invention.

Operations of the LDOs of the present invention may be summarized as a process 60 shown in FIG. 6. The process 60 may be applied for the LDOs 10, 20, 30, 40 and 50. The process 60 comprises the following steps:

Step 600: Start.

Step 602: Control the current flowing through the power transistor in response to the clock signal CLK.

Step 604: End.

Details of the process 60 may be referred to the paragraphs stated in the above, which is not narrated herein for brevity.

Note that, the coupling capacitor $C_{AC}$ and the driving circuit do not require a large circuit area. Compared to the prior art, the present invention requires less circuit area to suppress the ripples. In addition, the current through the power transistor is only increased within the first period $T_1$, instead of at all time. Thus, the LDO of the present invention consumes less power than the LDO in the art.

Notably, the embodiments stated in the above are utilized for illustrating the concept of the present invention. Those skilled in the art may make modifications and alterations accordingly, and not limited herein. For example, the LDO 10, 20, 30, 40 and 50 are customized for the load circuit 16, which draws more sink current during the low-state/first period $T_1$ of the clock signal CLK, to increase the current flowing through the power transistor during the first period $T_1$, but not limited thereto. The LDO of the present invention may increase the current flowing through the power transistor during the high-state/second period $T_2$ of the clock signal CLK, for the load circuit which draws more sink current during the second period $T_2$.

In summary, the present invention utilizes the control circuit to control the current flowing through the power transistor in response to the clock signal fed into the load circuit, so as to suppress the ripple within the output voltage of the LDO.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low dropout voltage regulator (LDO), coupled to a load circuit receiving a clock signal, the LDO comprising:
   an amplifier;
   a power transistor, comprising:
      a control terminal, coupled to an output terminal of the amplifier; and
      a first terminal, coupled to an input terminal of the amplifier and the load circuit; and
   a control circuit, receiving the clock signal, coupled to the control terminal of the power transistor, configured to generate a coupling signal according to the clock signal, so as to control a current flowing through the power transistor in response to the clock signal;
   wherein the control circuit controls the power transistor, such that a first current flowing through the power transistor during a first period of the clock signal is higher than a second current flowing through the power transistor during a second period of the clock signal; the clock signal remains as a first clock voltage during the first period, and the clock signal remains as a second clock voltage during the second period; the load circuit draws a first sink current in the first period and draws a second sink current in the second period, and the first sink current is larger than the second sink current.

2. The LDO of claim 1, wherein the first clock voltage is lower than the second clock voltage.

3. The LDO of claim 1, wherein the power transistor is an N-type transistor, the control circuit generates a first control voltage to the control terminal of the power transistor during the first period, the control circuit generates a second control voltage to the control terminal of the power transistor during the second period, and the first control voltage is higher than the second control voltage.

4. The LDO of claim 1, wherein the power transistor is a P-type transistor, the control circuit generates a third control voltage to the control terminal of the power transistor during the first period, the control circuit generates a fourth control voltage to the control terminal of the power transistor during the second period, and the third control voltage is lower than the fourth control voltage.

5. The LDO of claim 1, wherein the control circuit delivers a coupling signal to the control terminal of the power transistor, and the coupling signal is synchronized with the clock signal.

6. The LDO of claim 1, wherein the control circuit comprises a coupling capacitor coupled to the control terminal of the power transistor.

7. The LDO of claim 6, wherein the control circuit comprises a driving circuit coupled to the coupling capacitor.

8. The LDO of claim 7, wherein the driving circuit comprises an inverter.

9. The LDO of claim 7, wherein the driving circuit comprises a buffer.

10. The LDO of claim 7, wherein the driving circuit comprises a NAND gate.

11. The LDO of claim 7, wherein the driving circuit comprises a second transistor, the second transistor is controlled by the clock signal to be conducted or cutoff.

12. The LDO of claim 1, wherein the load circuit is an analog-to-digital converter (ADC).

13. A method, applied for a low dropout voltage regulator (LDO), wherein the LDO comprises an amplifier and a power transistor, and the power transistor comprises a control terminal coupled to an output terminal of the amplifier and a first terminal coupled to an input terminal of the amplifier and a load circuit receiving a clock signal, the method comprising:
   controlling a current flowing through the power transistor in response to the clock signal; and
   controlling the power transistor, such that a first current flowing through the power transistor during a first period of the clock signal is higher than a second current flowing through the power transistor during a second period of the clock signal;
   wherein the clock signal remains as a first clock voltage during the first period, and the clock signal remains as a second clock voltage during the second period;
   wherein the load circuit draws a first sink current in the first period and draws a second sink current in the second period, and the first sink current is larger than the second sink current.

14. The method of claim 13, wherein the first clock voltage is lower than the second clock voltage.

15. The method of claim 13, wherein the power transistor is an N-type transistor, and the method comprises:
   generating a first control voltage to the control terminal of the power transistor during the first period; and generating a second control voltage to the control terminal of the power transistor during the second period, wherein the first control voltage is higher than the second control voltage.

16. The method of claim 13, wherein the power transistor is a P-type transistor, and the method comprises:
generating a third control voltage to the control terminal of the power transistor during the first period; and
generating a fourth control voltage to the control terminal of the power transistor during the second period, wherein the third control voltage is lower than the fourth control voltage.

\* \* \* \* \*